(12) United States Patent
Ogawa

(10) Patent No.: US 12,504,462 B2
(45) Date of Patent: Dec. 23, 2025

(54) AUDIO AMPLIFIER CIRCUIT AND AUDIO OUTPUT DEVICE USING THE SAME

(71) Applicant: ROHM CO., LTD., Kyoto (JP)

(72) Inventor: Tetsuya Ogawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 228 days.

(21) Appl. No.: 18/502,265

(22) Filed: Nov. 6, 2023

(65) Prior Publication Data

US 2024/0151766 A1 May 9, 2024

(30) Foreign Application Priority Data

Nov. 9, 2022 (JP) ................................. 2022-179843

(51) Int. Cl.
| | |
|---|---|
| *G01R 31/28* | (2006.01) |
| *G01R 31/52* | (2020.01) |
| *G01R 31/54* | (2020.01) |
| *H03F 3/187* | (2006.01) |
| *H04R 3/00* | (2006.01) |

(52) U.S. Cl.
CPC ......... *G01R 31/2825* (2013.01); *G01R 31/52* (2020.01); *G01R 31/54* (2020.01); *H03F 3/187* (2013.01); *H04R 3/00* (2013.01); *H03F 2200/03* (2013.01)

(58) Field of Classification Search
CPC .... G01R 31/2825; G01R 31/52; G01R 31/54; H03F 3/187; H03F 2200/03; H04R 3/00
USPC .......................................... 381/58, 56, 57, 77
See application file for complete search history.

(56) References Cited

U.S. PATENT DOCUMENTS

| | | | |
|---|---|---|---|
| 9,438,181 B1* | 9/2016 | Baker | .................... H03F 1/0222 |
| 2019/0305737 A1* | 10/2019 | Saegusa | .............. H03F 3/45085 |

FOREIGN PATENT DOCUMENTS

| | | |
|---|---|---|
| JP | 2011182263 A | 9/2011 |
| JP | 2017112428 A | 6/2017 |

* cited by examiner

*Primary Examiner* — Thjuan K Addy
(74) *Attorney, Agent, or Firm* — CANTOR COLBURN LLP

(57) ABSTRACT

A current mirror circuit generates test currents supplied to a first output pin and a second output pin. The current mirror circuit includes first to sixth transistors and first to fifth switches. The first switch and the second switch are turned on in a first mode requiring a large amount of test current and turned off in a second mode requiring a small amount of a first test current and a second test current.

14 Claims, 6 Drawing Sheets

AUDIO AMPLIFIER CIRCUIT AND AUDIO OUTPUT DEVICE USING THE SAME

CROSS REFERENCE TO RELATED APPLICATIONS

The present invention claims priority under 35 U.S.C. § 119 to Japanese Application, 2022-179843, filed on Nov. 9, 2022, the entire contents of which being incorporated herein by reference.

TECHNICAL FIELD

The present disclosure relates to an audio amplifier circuit driving a speaker or an earphone.

BACKGROUND

In order to amplify audio signals and to drive electroacoustic transducers such as speakers and earphones, audio amplifiers (also referred to as power amplifiers) are used. In an audio amplifier, a load diagnostic circuit that detects various anomalies such as an open circuit, a short circuit, an output terminal power supply fault (shorted with respect to a power supply) or a ground fault (shorted with respect to ground) of an electroacoustic transducer as a load, is provided. For example, a load diagnostic circuit disclosed in patent document 1 obtains (sources) a current toward an output terminal of the load diagnostic circuit, and detects states such as normal, open circuit and short circuit states based on a voltage or current appearing at the output terminal.

PRIOR ART DOCUMENT

Patent Publication

[Patent document 1]: Japan Patent Publication No. 2011-182263
[Patent document 2]: Japan Patent Publication No. 2017-112428

DETAILED DESCRIPTION OF THE EMBODIMENTS

Summary of Embodiments

Figure 1:
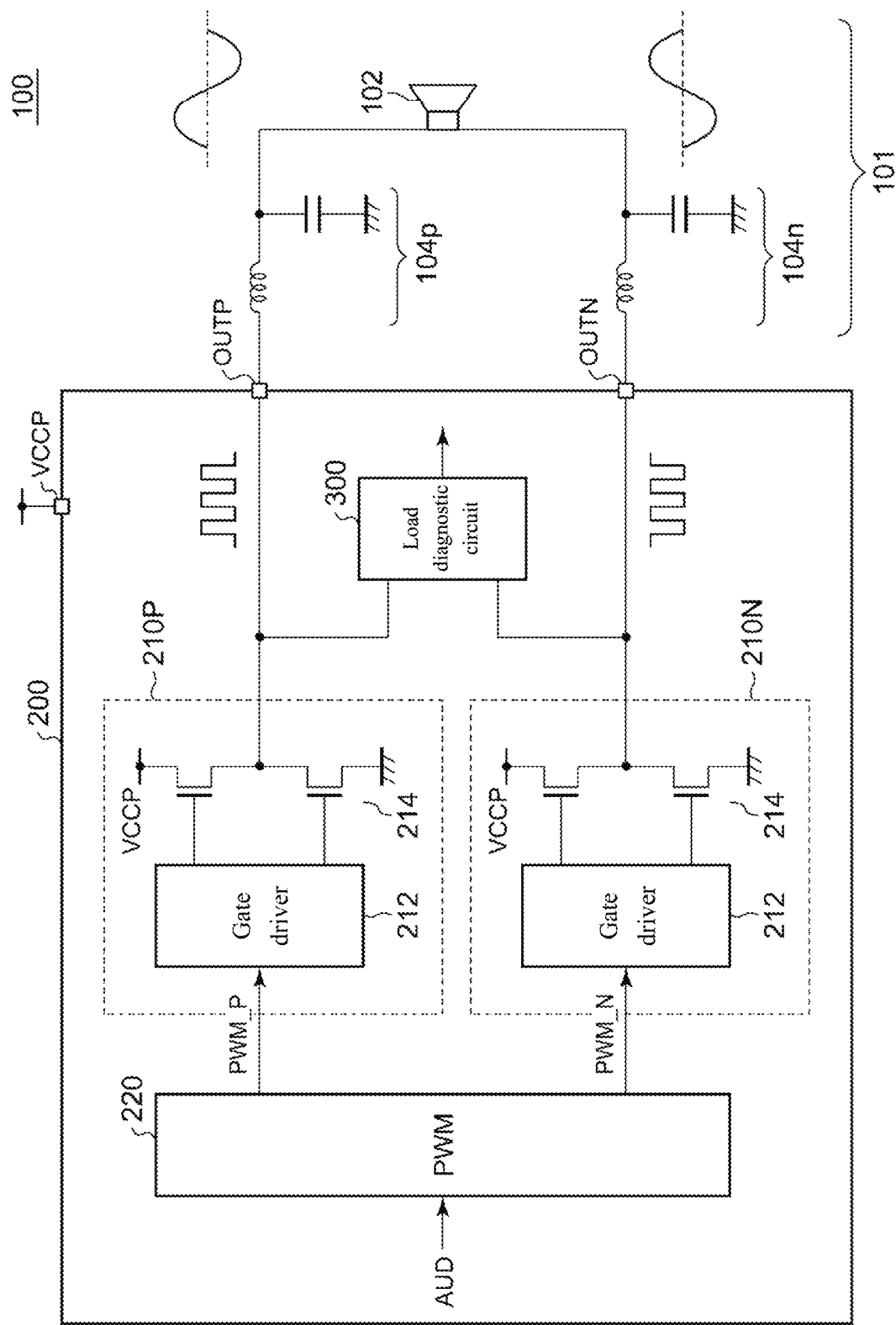
FIG. 1 is a block diagram of an audio output device having an audio amplifier circuit according to an embodiment.

A summary of several exemplary embodiments of the disclosure is given below. The summary serves as the preamble of the detailed description to be given shortly and aims at providing fundamental understanding of the embodiments by describing several concepts of one or more embodiments in brief. It should be noted that the summary is not to be construed as limitations to the breadth of the application or disclosure. The summary is not a comprehensive summary of all conceivable embodiments, nor does it intend to specify important elements of all embodiments or to define the scope of a part of or all aspects. For the sake of better description, "one embodiment" sometimes refers to one embodiment (an implementation example or a variation example) or multiple embodiments (implementation examples or variation examples) disclosed in the disclosure.

An embodiment disclosed by the present application relates to a bridged tied load (BTL) type audio amplifier. The audio amplifier includes: a first amplifier; a second amplifier, generating an output signal opposite to that of the first amplifier; a first output pin, connected to an output of the first amplifier; a second output pin, connected to an output of the second amplifier; a first monitoring pin; a second monitoring pin; a current generating circuit, connected to the first monitoring pin, configured to be switched on and off; a switch, disposed between the second monitoring pin and a fixed voltage line; and a load state determination circuit, configured to detect a state of a load according to a potential difference between the first monitoring pin and the second monitoring pin.

The load state determination circuit can also detect an open circuit of the load based on a comparison result between the potential difference and a predetermined threshold voltage. The load, that is, the electroacoustic transducer, has a normal resistance $R_L$ within a range of several Ω (2 to 32Ω), and the resistance $R_L$ is greater than hundreds of Ω when the load is open-circuit. When a current output by the current generating circuit is set to $I_{TEST}$, a potential difference $I_{TEST}*R_L$ is produced between the first monitoring pin and the second monitoring pin. An open state of the load can be detected by comparing the potential difference with a threshold $V_{OPEN}$.

Moreover, an external resistor is disposed between the first monitoring pin and one end of the load, and/or between the second monitoring pin and the other end of the load. When a value of the external resistor is set to $R_{EXT}$, a potential difference $I_{TEST}*(R_L+R_{EXT})$ is produced between the first monitoring pin and the second monitoring pin. An open-circuit state of the load can be detected by comparing the potential difference with the threshold $V_{OPEN}$, and a determination reference for open-circuit detection can be set according to the external resistor $R_{EXT}$.

An output of the current generating circuit can also be in the scale of tens of μA, in other words, less than 100 μA. Accordingly, noise generated from the load is prevented when the state of the load is determined.

The load state determination circuit can also include a voltage comparator. The voltage comparator receives respective voltages of the first monitoring pin and the second monitoring pin and has an input offset voltage equivalent to the threshold voltage. Thus, the potential difference between the two monitoring pins can be compared with a small threshold.

The audio amplifier can further include an enable pin configured to receive an enable signal that provides an instruction for open-circuit detection. The current generating circuit can be turned on when the enable signal provides an instruction for open-circuit detection.

The audio amplifier can further have a deactivation pin configured to receive a deactivation signal that indicates a deactivated state and releasing of the deactivated state. When the deactivation signal indicates a deactivated state and the enable signal provides an instruction for open-circuit detection, the load state determination circuit can be enabled.

The audio amplifier can further include an anomaly detection circuit configured to detect an anomaly of the audio amplifier, a diagnostic pin configured to notify the exterior whether there is an anomaly, and an output unit configured to change a state of the diagnostic pin according to outputs of the anomaly detection circuit and the load state determination circuit. When the load state determination circuit is enabled, the anomaly detection circuit can also be disabled.

The switch can also serve as a surge protection transistor.

The current generating circuit can gradually increase the output current along with time. Accordingly, noise generated from the electroacoustic transducer can be inhibited.

The audio amplifier can be monolithically integrated on a semiconductor substrate.

The so-called "monolithically integrated" includes a situation in which all constituting elements of a circuit are formed on a semiconductor substrate, or a situation in which main constituting elements of a circuit are integrated. In order to adjust circuit constants, a part of resistors or capacitors may be arranged outside the semiconductor substrate. By integrating circuits on one chip, the circuit area can be reduced, and characteristics of circuit elements can be kept uniform.

Embodiments

Details of preferred embodiments are given with the accompanying drawings below. The same or equivalent constituent elements, parts and processes in the accompanying drawings are represented by the same denotations, and repeated description is omitted as appropriate. Moreover, the embodiments are illustrative of and are not restrictive of the disclosure. All features and combinations thereof described in the embodiments are not necessarily intrinsic characteristics of the disclosure.

In the description of the application, an expression "a state of component A connected to component B" includes, in addition to a situation where component A and component B are directly connected, a situation where component A is indirectly connected to component B via another component, and the indirect connection does not result in substantial influences on their electrical connection or does not impair functions or effects exerted by their combination.

Similarly, an expression "a state of component C connected (arranged) between component A and component B" also includes, in addition to a situation where component A and component C, or component B and component C are directly connected, an indirect connection via another component, and the indirect connection does not result in substantial influences on their electrical connection or does not impair functions or effects exerted by their combination.

Moreover, in the description, denotations assigned to electrical signals such as voltage signals and current signals, and circuit elements such as resistors, capacitors and inductors are expressed with respective voltage values, current values or circuit constants (resistance values, capacitance values and inductance values) as needed.

The vertical axis and horizontal axis in the waveform diagrams or timing diagrams referenced in the disclosure are appropriately scaled up or scaled down for better understanding, and the waveforms are also simplified, exaggerated or emphasized for better understanding.

FIG. 1 shows a block diagram of an audio output device 100 having an audio amplifier circuit 200 according to an embodiment. The audio output device 100 is a bridged tied load (BTL) type class D amplifier, and includes an electroacoustic transducer 102, a low-pass filter (LPF) 104P, an LPF 104N, and the audio amplifier circuit 200.

The electroacoustic transducer 102 is a speaker or an earphone. A first output pin OUTP of the audio amplifier circuit 200 is connected to one end of the electroacoustic transducer 102 via the LPF 104P. A second output pin OUTN of the audio amplifier circuit 200 is connected to the other end of the electroacoustic transducer 102 via the LPF 104N. The electroacoustic transducer 102, the LPF 104P and the LPF 104N are collectively referred to as a load 101.

The audio amplifier circuit 200 is a functional integrated circuit (IC) monolithically integrated on a semiconductor substrate, and includes a pulse width modulator 220, a first amplifier 210P, a second amplifier 210N and a load diagnostic circuit 300.

The pulse width modulator 220 receives an analog or digital audio signal AUD and converts it to a pulse width modulation (PWM) signal. A non-inverting PWM signal PWM_P is supplied to the first amplifier 210P, and an inverting PWM signal PWM_N is supplied to the second amplifier 210N.

Each of the first amplifier 210P and the second amplifier 210N includes a gate driver 212 and an output section 214. The gate driver 212 drives the output section 214 based on the PWM signal from the pulse width modulator 220.

During non-regeneration of audio, the load diagnostic circuit 300 detects a short circuit or an open circuit of the electroacoustic transducer 102, a power supply fault or a ground fault of the first output pin OUTP, and a power supply fault or a ground fault of the second output pin OUTN (collectively referred to as a load anomaly). In the diagnosis performed by the load diagnostic circuit 300, the first amplifier 210P and the second amplifier 210N are set to be off (high impedance).

Figure 2:
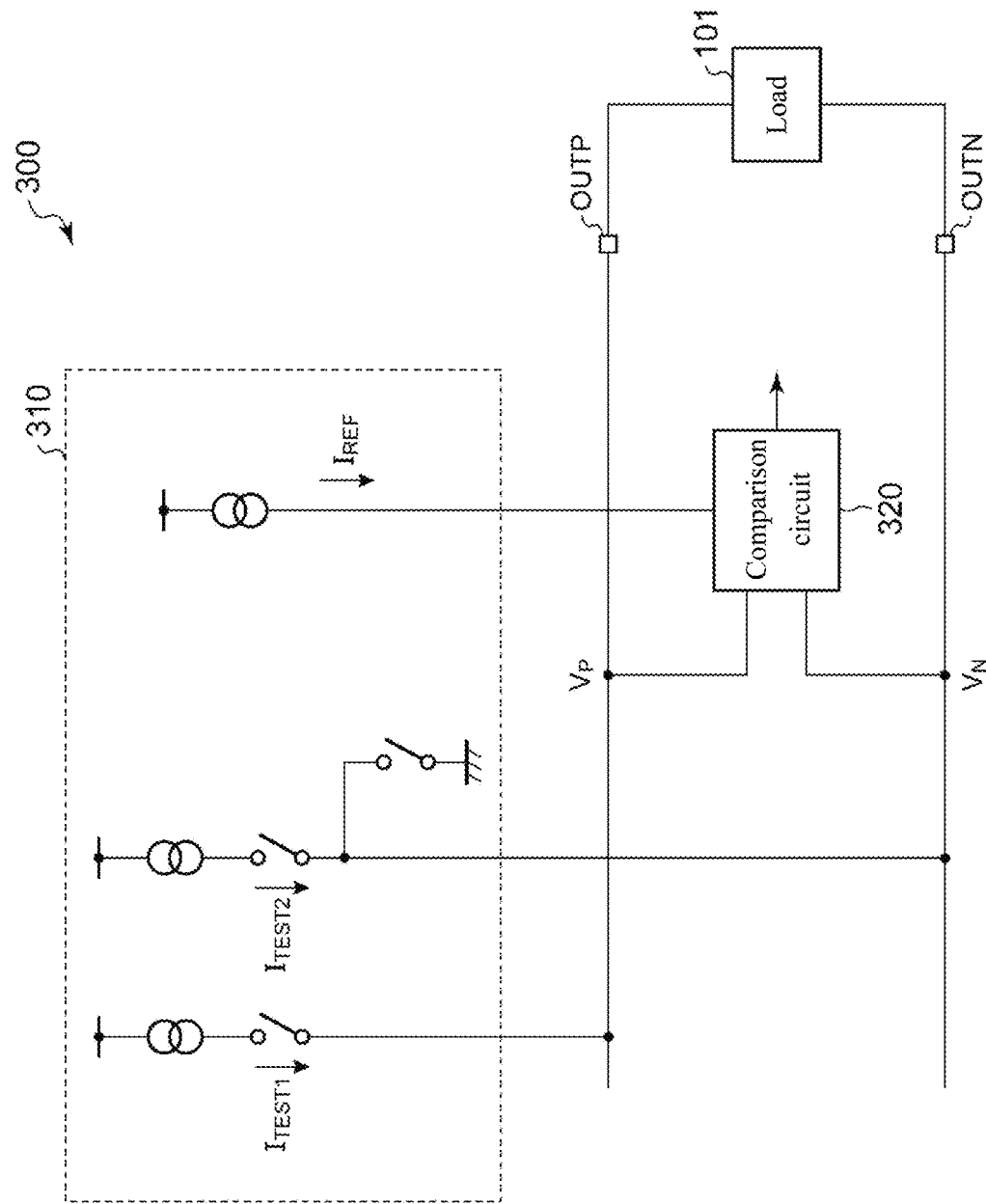
FIG. 2 is a circuit diagram of a fundamental configuration of a load diagnostic circuit.

FIG. 2 shows a circuit diagram of a fundamental configuration of the load diagnostic circuit 300. The load diagnostic circuit 300 includes a current generating circuit 310 and a comparison circuit 320.

In this embodiment, the load diagnostic circuit 300 can switch among a first mode to a third mode and detect different load anomalies according to each mode.

First mode: a short-circuit anomaly and an open-circuit anomaly of the load 101 are detected.

Second mode: a ground fault of an output pin is detected.

Third mode: a power supply fault of an output pin is detected.

Operations of the current generating circuit 310 and the comparison circuit 320 in the individual modes are described below.

First Mode

In this first mode, a short-circuit anomaly and an open-circuit anomaly of the load 101 are to be detected.

The current generating circuit 310, (i) in order to detect a short-circuit anomaly in the first mode, sources a first test current $I_{TEST1}$ in a first current amount $I_1$ from the first output pin OUTP, such that the second output pin OUTN is shorted with the ground. The comparison circuit 320, (i) in order to detect a short-circuit anomaly in the first mode, compares a potential difference $\Delta V$ between a voltage $V_P$ of the first output pin OUTP and a voltage $V_N$ of the second output pin OUTN with a first threshold voltage $V_{TH1}$ having a first voltage level $V_{SHORT}$.

The first test current $I_{TEST1}$ flows to the ground through the first output pin OUTP, the load 101 and the second output pin OUTN. When the load 101 is normal, a potential difference $\Delta V_{(NORM1)}$ between the first output pin OUTP and the second output pin OUTN is represented by equation (1).

$$\Delta V_{(NORM1)} = R_{NORM} \times I_1 \quad (1)$$

$R_{NORM}$ is a normal resistance of the load 101.

When the load 101 is short circuited, a potential difference $\Delta V_{(SHORT)}$ between the first output pin OUTP and the second output pin OUTN is represented by equation (2).

$$\Delta V_{(SHORT)} = R_{SHORT} \times I_1 \quad (2)$$

Thus, by determining the first voltage level $V_{SHORT}$ to be between $\Delta V_{(NORM1)}$ and $\Delta V_{(SHORT)}$, a normal state is determined when $\Delta V > V_{TH1}$, and a short-circuit anomaly is determined when $\Delta V < V_{TH1}$.

The current generating circuit 310, (i) in order to detect an open-circuit anomaly in the first mode, sources a second test current $I_{TEST2}$ in a second current amount $I_2$ from the first output pin OUTP, such that the second output pin OUTN is shorted with the ground. The second current amount $I_2$ is sufficiently small in comparison with the first current amount $I_1$.

The comparison circuit 320, (i) in order to detect an open-circuit anomaly in the first mode, compares the potential difference $\Delta V$ between the voltage $V_P$ of the first output pin OUTP and the voltage $V_N$ of the second output pin OUTN with the first threshold voltage $V_{TH1}$ having a second voltage level $V_{OPEN}$.

The second test current $I_{TEST2}$ flows to the ground through the first output pin OUTP, the load 101 and the second output pin OUTN. When the load 101 is normal, a potential difference $\Delta V_{(NORM2)}$ between the first output pin OUTP and the second output pin OUTN is represented by equation (3).

$$\Delta V_{(NORM2)} = R_{NORM} \times I_2 \quad (3)$$

When the load 101 is open-circuit, a potential difference $\Delta V_{(OPEN)}$ between the first output pin OUTP and the second output pin OUTN is represented by equation (4).

$$\Delta V_{(OPEN)} = R_{OPEN} \times I_2 \quad (4)$$

Thus, by determining the second voltage level $V_{OPEN}$ to be between $\Delta V_{(NORM2)}$ and $\Delta V_{(OPEN)}$, a normal state is determined when $\Delta V < V_{OPEN}$, and an open-circuit anomaly is determined when $\Delta V > V_{OPEN}$.

Second Mode

A ground fault of an output pin is to be detected in the second mode. The current generating circuit 310, (ii) in the second mode, sources the first test current $I_{TEST1}$ in a third current amount $I_3$ from the first output pin OUTP, and sources the second test current $I_{TEST2}$ in the same third current amount $I_3$ from the second output pin OUTN. The third current amount $I_3$ is typically greater than or equal to the first current amount $I_1$.

In the second mode, the comparison circuit 320 compares at least one of the voltage $V_P$ of the first output pin OUTP and the voltage $V_N$ of the second output pin OUTN with a second threshold voltage $V_{TH2}$.

In a normal state in which neither of the first output pin OUTP and the second output pin OUTN contains a ground fault, the voltage $V_P$ of the first output pin OUTP and the voltage $V_N$ of the second output pin OUTN become sufficiently high.

Conversely, when either of the first output pin OUTP and the second output pin OUTN (or an interior of the load 101) contains a ground fault, the voltages $V_P$ and $V_N$ are reduced.

For example, when the first output pin OUTP contains a ground fault, if the resistance of a path of the ground fault is set to $R_{GND}$, the voltage $V_P$ of the first output pin OUTP becomes $V_P = R_{GND} \times I_3$.

Thus, if the voltage level of the second threshold voltage $V_{TH2}$ is determined as higher than $R_{GND} \times I_3$, a normal state is determined when $V_P > V_{TH2}$, and a ground fault is determined when $V_P < V_{TH2}$. The same applies to the side of the second output pin OUTN.

In the second mode, a reference current $I_{REF}$ generated by the current generating circuit 310 is supplied to the comparison circuit 320. The reference current $I_{REF}$ is proportional to the third current amount $I_3$. By setting the voltage proportional to the reference current $I_{REF}$ as the second threshold voltage $V_{TH2}$, compared to when the second threshold voltage $V_{TH2}$ is determined to be irrelevant to the third current amount $I_3$, a ground fault can be correctly determined.

Third Mode

A power supply fault of an output pin is to be detected in the third mode. In the third mode, in the current generating circuit 310, a first output node OUT1 and a second output node OUT2 become high impedance, and both of the first test current $I_{TEST1}$ and the second test current $I_{TEST2}$ become zero.

In the third mode, the comparison circuit 320 compares at least one of the voltage $V_P$ of the first output pin OUTP and the voltage $V_N$ of the second output pin OUTN with a third threshold voltage $V_{TH3}$ proportional to a power supply voltage $V_{CC}$. A ground fault is determined when $V_P > V_{TH3}$ or $V_N > V_{TH3}$.

The function of the load diagnostic circuit 300 is as described above. The specific configuration of the load diagnostic circuit 300 is to be described below.

Figure 3:
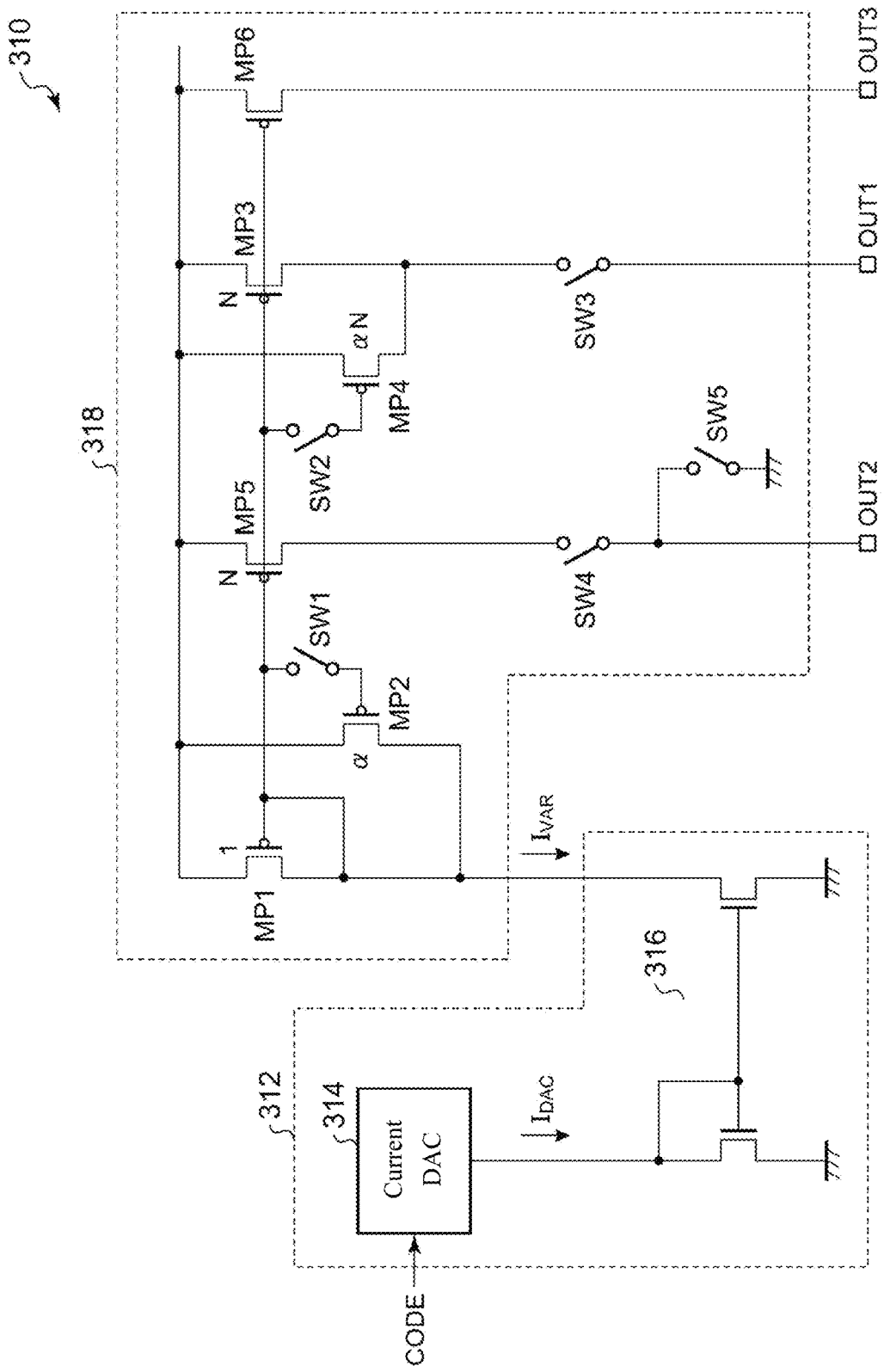
FIG. 3 is a circuit diagram of a current generating circuit according to an embodiment.

FIG. 3 shows a circuit diagram of the current generating circuit 310 according to an embodiment. The current generating circuit 310 can include a variable current source 312 and a current mirror circuit 318.

The variable current source 312 generates a variable current $I_{VAR}$. For example, the variable current source 312 includes a current digital-to-analog converter (DAC) 314 and a current mirror circuit 316. The current DAC 314 generates a current $I_{DAC}$ corresponding to a digital control code CODE. The current mirror circuit 316 returns the current $I_{DAC}$ and outputs the variable current $I_{VAR}$.

The first output node OUT1 is connected to the first output pin OUTP and is for the first test current $I_{TEST1}$ to pass through. The second output node OUT2 is connected to the second output pin OUTN and is for the second test current $I_{TEST2}$ to pass through. The third output node OUT3 is connected to the load diagnostic circuit 300 and is for the reference current $I_{REF}$ to pass through.

A first transistor MP1 includes a drain connected to the variable current source 312 and a gate connected to the drain. A second transistor MP2 is connected in parallel with the first transistor MP1. A first switch SW1 connects between a gate of the second transistor MP2 and the gate of the first transistor MP1.

A gate of the third transistor MP3 is connected to a gate of the first transistor MP1. A third switch SW3 connects between a drain of the third transistor MP3 and the first output node OUT1. A fourth transistor MP4 is connected in parallel with the third transistor MP3. A second switch SW2 connects between a gate of the fourth transistor MP4 and the gate of the third transistor MP3.

A gate of a fifth transistor MP5 is connected to the gate of the first transistor MP1. A fourth switch SW4 connects between a drain of the fifth transistor MP5 and the second output node OUT2.

A fifth switch SW5 connects between the second output node OUT2 and the ground.

The switches in the individual modes are controlled as below.

First Mode
  First switch SW1: on
  Second switch SW2: on
  Third switch SW3: on
  Fourth switch SW4: off
  Fifth switch SW5: on
Second Mode
  First switch SW1: off
  Second switch SW2: off
  Third switch SW3: on
  Fourth switch SW4: on
  Fifth switch SW5: off
Third Mode
  First switch SW: off (don't care)
  Second switch SW2: off (don't care)
  Third switch SW3: off
  Fourth switch SW4: off
  Fifth switch SW5: off The size of the first transistor MP1 is set to 1, and the sizes of the third transistor MP3 and the fifth transistor MP5 are set to N. Moreover, the size of the second transistor MP2 is set to be $\alpha$ times (that is, $\alpha$) the size of the first transistor MP1, and the size of the fourth transistor MP4 is set to be $\alpha$ times (that is, $\alpha N$) the size of the third transistor MP3.

In the first mode, the first switch SW1 and the second switch SW2 are on. At this point in time, the size of the transistors on the input side of the current mirror circuit 318 is $(1+\alpha)$, and the size of the transistors on the side of the first output node OUT1 of the current mirror circuit 318 is $(N+\alpha N)=(1+\alpha) N$. Thus, the current $I_{TEST1}$ that is N times the variable current $I_{VAR}$ passes through the first output node OUT1.

In the second mode, the first switch SW1 and the second switch SW2 are off. At this point in time, the size of the transistors on the input side of the current mirror circuit 318 is 1, the size of the transistors on the side of the first output node OUT1 of the current mirror circuit 318 is N, and the size of the transistors on the side of the second output node OUT2 of the current mirror circuit 318 is N. Thus, the current $I_{TEST1}$ that is N times the variable current $I_{VAR}$ passes through the first output node OUT1, and the current $I_{TEST2}$ that is N times the variable current $I_{VAR}$ passes through the second output node OUT2.

According to the current generating circuit 310, a current mirror circuit with high pairing properties can be implemented in a minimum required size, enabling high-precision load determination.

The advantages of the current generating circuit 310 can become more apparent in comparison with a comparison technique.

Figure 4:
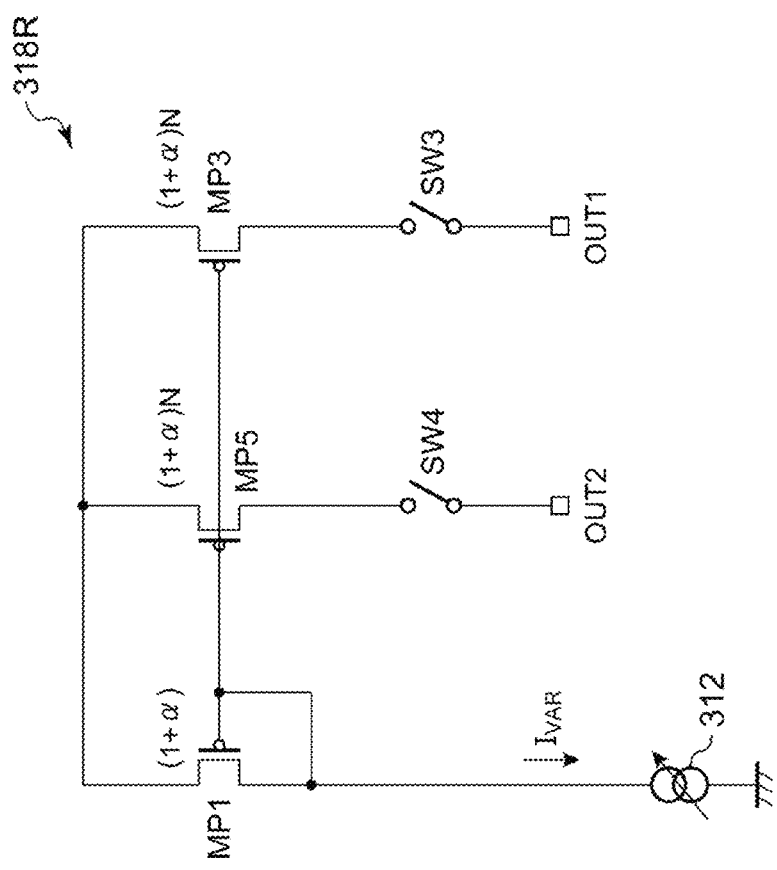
FIG. 4 is a circuit diagram of a current generating circuit of a comparison technique.

FIG. 4 shows a circuit diagram of a current generating circuit 310R of a comparison technique. A current mirror circuit 318R of the current generating circuit 310R includes a first transistor MP1, a third transistor MP3 and a fifth transistor MP5. In order to provide the current mirror circuit 318R with the same precision as the current mirror circuit 318 in FIG. 3, it is necessary for the size of the first transistor MP1 to be $(1+\alpha)$ and the sizes of the third transistor MP3 and the fifth transistor MP5 to be $(1+\alpha)$ N. At this point in time, the size of the current mirror circuit 318R in FIG. 4 becomes $(1+\alpha)+(1+\alpha) N+(1+\alpha)N$.

In contrast, the size of the current mirror circuit 318 in FIG. 3 becomes $(1+\alpha)+N+(1+\alpha) N$.

Accordingly, the circuit area can be reduced.

If $\alpha=9$ and $N=10$, it is learned that the size of the current mirror circuit 318R is 210, and in contrast, the size of the current mirror circuit 318 is 120, hence significantly reducing the size.

Figure 5:
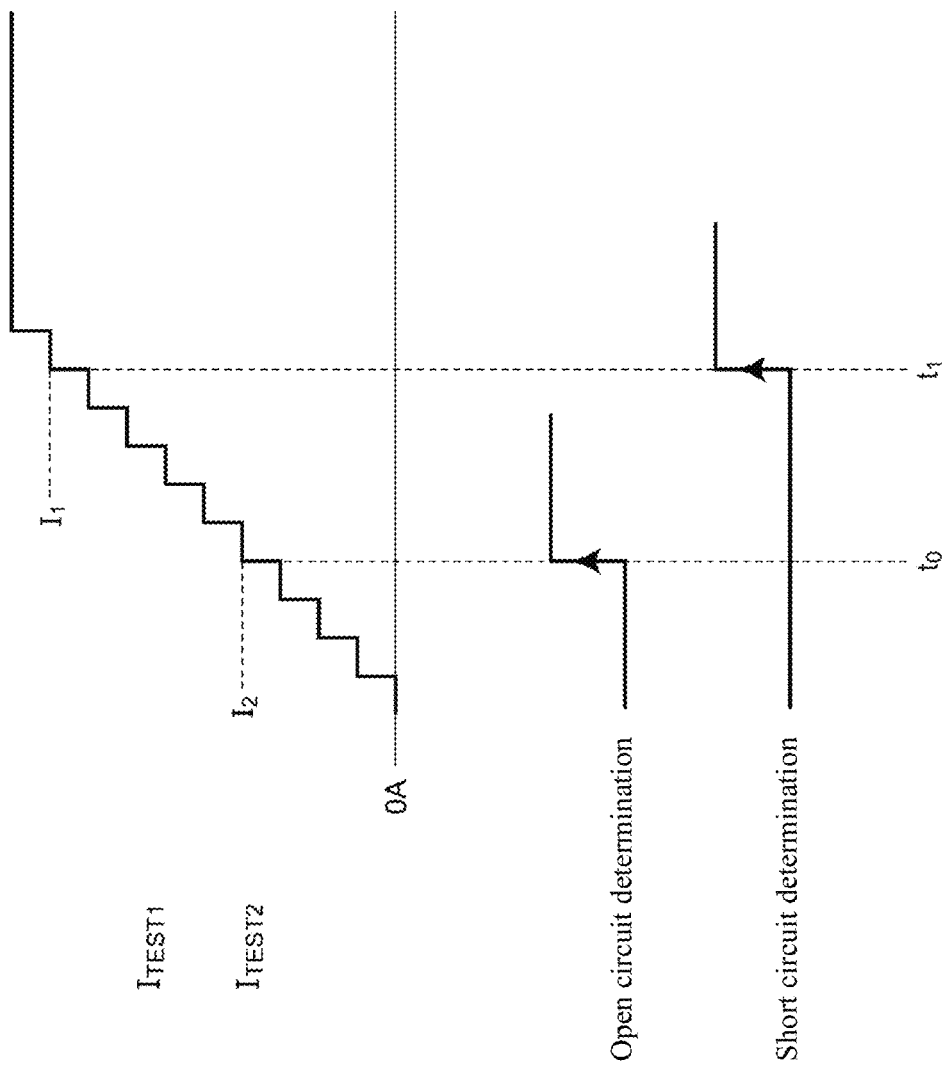
FIG. 5 is a diagram of a test sequence in a first mode.

FIG. 5 shows a diagram of a test sequence in a first mode. In the first mode, the code CODE input to the current DAC 314 is swept along with time. Accordingly, the first test current $I_{TEST1}$ and the second test current $I_{TEST2}$ are increased with time.

At a timing $t_0$ at which the first test current $I_{TEST1}$ and the second test current $I_{TEST2}$ reach the second current amount $I_2$, the comparison circuit 320 compares the potential difference $\Delta V$ between the two voltages $V_P$ and $V_N$ with the first threshold voltage $V_{TH1}$ having the second voltage level $V_{OPEN}$ and detects for an open-circuit anomaly.

Moreover, at a timing at which the first test current $I_{TEST1}$ and the second test current $I_{TEST2}$ increase to the first current amount $I_1$, the comparison circuit 320 compares the potential difference $\Delta V$ between the two voltages $V_P$ and $V_N$ with the first threshold voltage $V_{TH1}$ having the first voltage level $V_{SHORT}$ and detects for a short-circuit anomaly.

According to the sequence above, two anomalies can be summarized and determined. Moreover, because the test currents $I_{TEST1}$ and $I_{TEST2}$ change slowly along with time, noise generated from the electroacoustic transducer 102 can be prevented.

Figure 6:
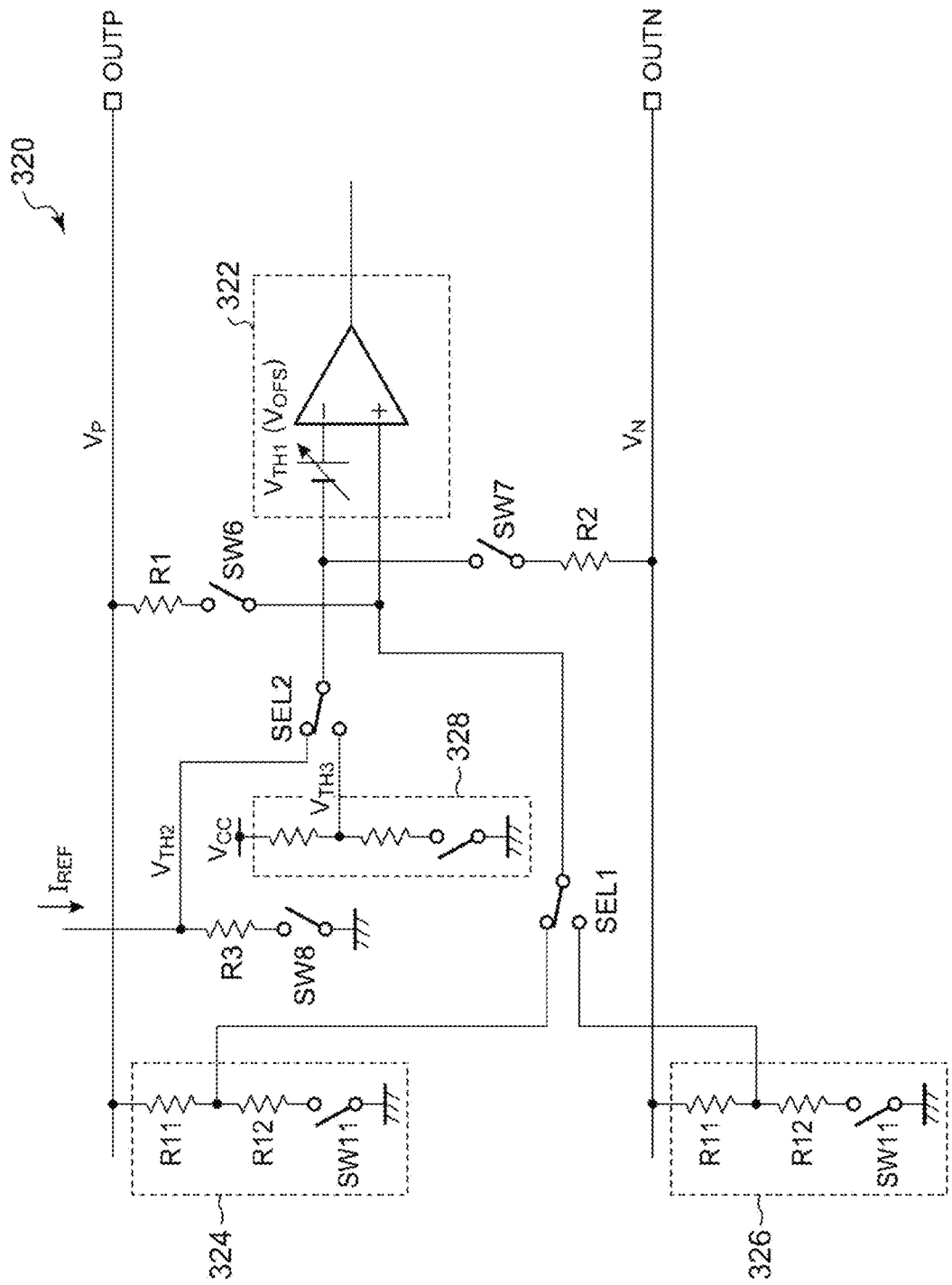
FIG. 6 is a circuit diagram of a comparison circuit according to an embodiment.

FIG. 6 shows a circuit diagram of the comparison circuit 320 according to an embodiment. The comparison circuit 320 includes a comparator 320 with an offset, a first resistor R1, a second resistor R2, a third resistor R3, a sixth switch SW6, a seventh switch SW7, an eighth switch SW8, a first voltage dividing circuit 324, a second voltage dividing circuit 326, a third voltage dividing circuit 328 and selectors SEL1 and SEL2.

The comparator 322 with an offset has a controllable input offset voltage $V_{OFS}$.

A non-inverting input terminal of the comparator 322 with an offset is connected to the first output pin OUTP via the first resistor R1 and the sixth switch SW6. An inverting input terminal of the comparator 322 with an offset is connected to the second output pin OUTN via the second resistor R2 and the seventh switch SW7. The sixth switch SW6 and the seventh switch SW7 are on in the first mode. In the first mode, an output of the comparator 322 with an offset represents a comparison result between $V_N+V_{OFS}$ and $V_P$, and this is exactly the comparison result of $\Delta V=V_P-V_N$ and $V_{OFS}$. That is to say, in the first mode, the input offset voltage $V_{OFS}$ of the comparator 322 with an offset becomes the first threshold voltage $V_{TH1}$.

In the second mode and the third mode, the input offset voltage $V_{OFS}$ of the comparator 322 with an offset is set to zero.

The first voltage dividing circuit 324 becomes active in the second mode and the third mode and divides the voltage $V_P$ of the first output pin OUTP. The second voltage dividing circuit 326 becomes active in the second mode and the third mode and divides the voltage $V_N$ of the second output pin OUTN. The first voltage dividing circuit 324 and the second voltage dividing circuit 326 includes resistors R11 and R12 and a switch SW11 connected in series. The switch SW11 is off in the first mode and is on in the second mode and the third mode.

The selector SEL1 selects one of an output voltage of the first voltage dividing circuit 324 and an output voltage of the second voltage dividing circuit 326 in the second mode. The selected voltage is input to the non-inverting input terminal of the comparator 322 with an offset.

The third resistor R3 and the eighth switch SW8 are disposed on a path of the reference current $I_{REF}$. A voltage drop of the third resistor R3 is the second threshold voltage $V_{TH2}$. The third voltage dividing circuit 328 divides the power supply voltage $V_{CC}$ to generate the third threshold voltage $V_{TH3}$.

The selector SEL2 selects the second threshold voltage $V_{TH2}$ in the second mode and selects the third threshold voltage $V_{TH3}$ in the third mode.

In the second mode, the comparator 322 with an offset compares the voltage $V_P/V_N$ selected by the first selector SEL1 with the second threshold voltage $V_{TH2}$. The output of the comparator 322 with an offset indicates whether the output pin OUT1/OUT2 contains a ground fault.

In the third mode, the comparator 322 with an offset compares the voltage $V_P/V_N$ selected by the first selector SEL1 with the third threshold voltage $V_{TH3}$. The output of the comparator 322 with an offset indicates whether the output pin OUT1/OUT2 contains a power supply fault.

In the embodiment, the audio amplifier circuit 200 having one channel is described; however, the audio amplifier circuit 200 can also include a plurality of channels. In this case, the effect of inhibiting the area of the current mirror circuit 318 becomes even more apparent along with the increase in the number of channels.

(Notes)

The present application discloses the following techniques.

(Item 1)

An audio amplifier circuit, which is a bridged tied load (BTL) type audio amplifier circuit, comprising:
  a first output pin, connected to a first end of an electroacoustic transducer as a load;
  a second output pin, connected to a second end of the electroacoustic transducer;
  a first amplifier, including an output connected to the first output pin;
  a second amplifier, including an output connected to the second output pin; and
  a load diagnostic circuit, connected to the first output pin and the second output pin,
  wherein the load diagnostic circuit includes:
    a current generating circuit, (i) in a first mode, configured to source a first test current from the first output pin and connecting between the second output pin and ground, and (ii) in a second mode, configured to source the first test current from the first output pin and a second test current from the second output pin; and
    a comparison circuit, (i) in the first mode, configured to compare a potential difference between a voltage of the first output pin and a voltage of the second output pin with a threshold voltage, and (ii) in the second mode, configured to compare at least one of the voltage of the first output pin and the voltage of the second output pin with a second threshold voltage,
  wherein the current generating circuit includes:
    a variable current source, configured to generate a variable current;
    a first output node, connected to the first output pin and through which the first test current passes;
    a second output node, connected to the second output pin and through which the second test current passes;
    a first transistor, including a drain connected to the variable current source and a gate connected to the drain;
    a second transistor, connected in parallel with the first transistor;
    a first switch, connecting between a gate of the second transistor and the gate of the first transistor;
    a third transistor, including a gate connected to the gate of the first transistor;
    a third switch, connecting between a drain of the third transistor and the first output node;
    a fourth transistor, connected in parallel with the third transistor;
    a second switch, connecting between a gate of the fourth transistor and the gate of the third transistor;
    a fifth transistor, including a gate connected to the gate of the first transistor;
    a fourth switch, connecting between a drain of the fifth transistor and the second output node; and
    a fifth switch, connecting between the second output node and ground.

(Item 2)

The audio amplifier circuit of Item 1, wherein in the first mode, the variable current source is configured to sweep the variable current, a short-circuit state of the load is determined according to an output of the comparison circuit when the variable current is in a first current amount, and an open-circuit state of the load is determined according to the output of the comparison circuit when the variable current is in a second current amount less than the first current amount.

(Item 3)

The audio amplifier circuit of Item 1 or 2, wherein the current generating circuit is configured to set the first test current and the second test current to zero in a third mode, and the comparison circuit, in the third mode, is configured to compare at least one of the voltage of the first output pin and the voltage of the second output pin with a third threshold voltage proportional to a power supply voltage.

(Item 4)

The audio amplifier circuit of any one of Items 1 to 3, wherein the current generating circuit further includes:
  a third output node, through which a reference current passes;
  a fourth output transistor, including a drain connected to the third output node and a gate connected to the gate of the first transistor,
  wherein the comparison circuit includes a resistor disposed on a path of the reference current, and a voltage source of the resistor is the second threshold voltage.

(Item 5)

The audio amplifier circuit of Item 4, wherein the comparison circuit further includes a switch connected in series with the resistor and configured to be turned on in the second mode.

(Item 6)

The audio amplifier circuit of any one of Items 1 to 4, wherein the comparison circuit includes:
  a first voltage dividing circuit, configured to be off in the first mode and divide the voltage of the first output pin in the second mode; and
  a second voltage dividing circuit, configured to be off in the first mode and divide the voltage of the second output pin in the second mode.

(Item 7)

The audio amplifier circuit of Item 3, wherein the comparison circuit includes a third voltage dividing circuit configured to be off in the first mode and the second mode and divide the power supply voltage to generate the third threshold voltage in the third mode.

(Item 8)

The audio amplifier circuit of any one of Items 1 to 7, wherein the audio amplifier circuit is monolithically integrated on a semiconductor substrate.

(Item 9)

An audio output device, comprising:
an electroacoustic transducer; and
the audio amplifier circuit of any one of Items 1 to 8, configured to drive the electroacoustic transducer.

The present disclosure is described in detail by way of the specific terms and expressions on the basis of the embodiments. However, these embodiments are for conveying principles and applications in one aspect of the present disclosure, and further variations and modifications to the configurations may be made to these embodiments without departing from the scope of concepts of the present disclosure defined in the appended claims.

The invention claimed is:

1. An audio amplifier circuit, which is a bridged tied load (BTL) type audio amplifier circuit, comprising:
   a first output pin, connected to a first end of an electroacoustic transducer as a load;
   a second output pin, connected to a second end of the electroacoustic transducer;
   a first amplifier, including an output connected to the first output pin;
   a second amplifier, including an output connected to the second output pin; and
   a load diagnostic circuit, connected to the first output pin and the second output pin, wherein the load diagnostic circuit includes:
   a current generating circuit,
      (i) in a first mode, configured to source a first test current from the first output pin and connecting between the second output pin and ground,
      (ii) in a second mode, configured to source the first test current from the first output pin and a second test current from the second output pin; and
   a comparison circuit,
      (i) in the first mode, configured to compare a potential difference between a voltage of the first output pin and a voltage of the second output pin with a threshold voltage,
      (ii) in the second mode, configured to compare at least one of the voltage of the first output pin and the voltage of the second output pin with a second threshold voltage,
   wherein the current generating circuit includes:
      a variable current source, configured to generate a variable current;
      a first output node, connected to the first output pin and through which the first test current passes;
      a second output node, connected to the second output pin and through which the second test current passes;
      a first transistor, including a drain connected to the variable current source and a gate connected to the drain;
      a second transistor, connected in parallel with the first transistor;
      a first switch, connecting between a gate of the second transistor and the gate of the first transistor;
      a third transistor, including a gate connected to the gate of the first transistor;
      a third switch, connecting between a drain of the third transistor and the first output node;
      a fourth transistor, connected in parallel with the third transistor;
      a second switch, connecting between a gate of the fourth transistor and the gate of the third transistor;
      a fifth transistor, including a gate connected to the gate of the first transistor;
      a fourth switch, connecting between a drain of the fifth transistor and the second output node; and
      a fifth switch, connecting between the second output node and ground.

2. The audio amplifier circuit of claim 1, wherein
in the first mode, the variable current source is configured to sweep the variable current,
a short-circuit state of the load is determined according to an output of the comparison circuit when the variable current is in a first current amount, and
an open-circuit state of the load is determined according to the output of the comparison circuit when the variable current is in a second current amount less than the first current amount.

3. The audio amplifier circuit of claim 1, wherein
the current generating circuit is configured to set the first test current and the second test current to zero in a third mode, and
the comparison circuit, in the third mode, is configured to compare at least one of the voltage of the first output pin and the voltage of the second output pin with a third threshold voltage proportional to a power supply voltage.

4. The audio amplifier circuit of claim 2, wherein
the current generating circuit is configured to set the first test current and the second test current to zero in a third mode, and
the comparison circuit, in the third mode, is configured to compare at least one of the voltage of the first output pin and the voltage of the second output pin with a third threshold voltage proportional to a power supply voltage.

5. The audio amplifier circuit of claim 1, wherein the current generating circuit further includes:
   a third output node, through which a reference current passes;
   a fourth output transistor, including a drain connected to the third output node and a gate connected to the gate of the first transistor, wherein
   the comparison circuit includes a resistor disposed on a path of the reference current, and a voltage source of the resistor is the second threshold voltage.

6. The audio amplifier circuit of claim 2, wherein the current generating circuit further includes:
   a third output node, through which a reference current passes;
   a fourth output transistor, including a drain connected to the third output node and a gate connected to the gate of the first transistor, wherein
   the comparison circuit includes a resistor disposed on a path of the reference current, and a voltage source of the resistor is the second threshold voltage.

7. The audio amplifier circuit of claim 5, wherein the comparison circuit further includes a switch connected in series with the resistor and configured to be turned on in the second mode.

8. The audio amplifier circuit of claim 1, wherein the comparison circuit includes:
- a first voltage dividing circuit, configured to be off in the first mode and divide the voltage of the first output pin in the second mode; and
- a second voltage dividing circuit, configured to be off in the first mode and divide the voltage of the second output pin in the second mode.

9. The audio amplifier circuit of claim 2, wherein the comparison circuit includes:
- a first voltage dividing circuit, configured to be off in the first mode and divide the voltage of the first output pin in the second mode; and
- a second voltage dividing circuit, configured to be off in the first mode and divide the voltage of the second output pin in the second mode.

10. The audio amplifier circuit of claim 3, wherein the comparison circuit includes a third voltage dividing circuit configured to be off in the first mode and the second mode and divide the power supply voltage to generate the third threshold voltage in the third mode.

11. The audio amplifier circuit of claim 1, wherein the audio amplifier circuit is monolithically integrated on a semiconductor substrate.

12. The audio amplifier circuit of claim 2, wherein the audio amplifier circuit is monolithically integrated on a semiconductor substrate.

13. An audio output device, comprising:
an electroacoustic transducer; and
the audio amplifier circuit of claim 1, configured to drive the electroacoustic transducer.

14. An audio output device, comprising:
an electroacoustic transducer; and
the audio amplifier circuit of claim 2, configured to drive the electroacoustic transducer.

* * * * *